United States Patent
Benedict et al.

(10) Patent No.: US 11,171,101 B2
(45) Date of Patent: Nov. 9, 2021

(54) PROCESS FOR REMOVING BOND FILM FROM CAVITIES IN PRINTED CIRCUIT BOARDS

(71) Applicant: RAYTHEON COMPANY, Waltham, MA (US)

(72) Inventors: James E. Benedict, Lowell, MA (US); Paul A. Danello, Marlborough, MA (US); Mikhail Pevzner, Woburn, MA (US); Thomas V. Sikina, Acton, MA (US); Andrew R. Southworth, Lowell, MA (US)

(73) Assignee: RAYTHEON COMPANY, Waltham, MA (US)

( * ) Notice: Subject to any disclaimer, the term of this patent is extended or adjusted under 35 U.S.C. 154(b) by 43 days.

(21) Appl. No.: 16/836,470

(22) Filed: Mar. 31, 2020

(65) Prior Publication Data

US 2021/0305187 A1    Sep. 30, 2021

(51) Int. Cl.
*H01L 23/00*    (2006.01)

(52) U.S. Cl.
CPC .............. *H01L 24/11* (2013.01); *H01L 24/45* (2013.01); *H01L 24/73* (2013.01); *H01L 2224/11602* (2013.01); *H01L 2224/45147* (2013.01); *H01L 2224/73207* (2013.01)

(58) Field of Classification Search
CPC ........................ H01L 24/11; H01L 2224/11602
See application file for complete search history.

(56) References Cited

U.S. PATENT DOCUMENTS

| | | | |
|---|---|---|---|
| 5,675,180 A | 10/1997 | Pedersen et al. | |
| 6,267,650 B1 | 7/2001 | Hembree | |
| 7,608,929 B2 | 10/2009 | Hu | |
| 8,629,543 B2 | 1/2014 | McElrea et al. | |
| 10,091,888 B2 | 10/2018 | Lan et al. | |
| 2019/0148832 A1* | 5/2019 | Adams | H05K 1/0221 343/895 |
| 2020/0367357 A1* | 11/2020 | Benedict | H05K 1/116 |

FOREIGN PATENT DOCUMENTS

| | | |
|---|---|---|
| EP | 0914757 A1 | 5/1999 |
| WO | 2019168992 A1 | 9/2019 |

OTHER PUBLICATIONS

International Search Report and Written Opinion in International Patent Application No. PCT/US2021/016294 dated May 10, 2021.

* cited by examiner

*Primary Examiner* — Yu-Hsi D Sun
(74) *Attorney, Agent, or Firm* — Lando & Anastasi, LLP

(57) ABSTRACT

A process of fabricating an electromagnetic circuit includes providing a first sheet of dielectric material including a top surface having at least one conductive trace and depositing a solder bump on the at least one conductive trace. The process further includes applying a second sheet of dielectric material to the first sheet of dielectric material with bond film sandwiched in between, the second sheet of dielectric material having a through-hole providing access to the solder bump. The process further includes bonding the first and second dielectric materials to one another and removing bond film resin from the solder bump. The process further includes machining the solder bump by the drilling or milling process to achieve a desired amount of solder in the solder bump.

20 Claims, 2 Drawing Sheets

PROCESS FOR REMOVING BOND FILM FROM CAVITIES IN PRINTED CIRCUIT BOARDS

GOVERNMENT RIGHTS

Not applicable.

BACKGROUND

Radio frequency (RF) and electromagnetic circuits may be manufactured using conventional printed circuit board (PCB) processes. Conventional PCB manufacturing processes may include lamination, electroplating, masking, etching, and other complex process steps, and may require multiple steps, expensive and/or hazardous materials, multiple iterations, extensive labor, etc., all leading to higher cost and slower turnaround time. Additionally, conventional PCB manufacturing processes have limited ability to allow for small feature sizes, such as signal trace (e.g., stripline) dimensions, and dimensions of dielectric materials between conductors (e.g., dielectric thickness, inter-via spacing, etc.), thereby limiting the range of highest frequency signals that may be supported by such circuits.

Signal conductors (e.g., signal traces, strip lines, interlayer "vertical" feeds) and reference surfaces and conductors (e.g., ground planes, Faraday boundaries or "walls") within various circuits are suitable for various circuit board manufacturing, including radio frequency circuit embodiments. Additive and subtractive manufacturing techniques provide structures for conveyance and containment of various signals, and particularly of radio frequency signals in microwave and millimeter wave ranges.

In the PCB manufacturing process, it is very difficult to create a blind hole because of the bond film that flows in between the layers of the PCB during the manufacturing process. After the boards are bonded or laminated together with the bond film, a blind hole can be created by laser drilling, or mechanical drilling. In another embodiment, holes can be pre-drilled prior to bonding or lamination. It is extremely difficult to remove the layer of bond film without removing part of the layer of copper that is on the target layer.

SUMMARY

One aspect of the present disclosure is directed to a process of fabricating an electromagnetic circuit. In one embodiment, the process comprises: providing a first sheet of dielectric material including a top surface having at least one conductive trace; depositing a solder bump on the at least one conductive trace; applying a second sheet of dielectric material to the first sheet of dielectric material with bond film sandwiched in between, the second sheet of dielectric material having a through-hole providing access to the solder bump; bonding the first and second dielectric materials to one another; and removing bond film resin from the solder bump.

Embodiments of the process further may include securing copper wire to the solder bump to secure a through-hole component mounted by the copper wire. The copper wire may be secured to the solder bump by a soldering or reflow process. Removing bond film resin may include using a drilling or milling process to remove the bond film resin. Using the drilling or milling process to remove the bond film resin can be a manual procedure or an automated procedure. The process further may include machining the solder bump by the drilling or milling process to achieve a desired amount of solder in the solder bump. The solder bump may include lead-based or lead-free solder. The through-hole may be created by drilling through the second dielectric layer. Bonding the first and second dielectric materials to one another may include curing the dielectric layers under pressure and temperature to form an integral final product. The process further may include applying a silver nanoparticle paste to the solder bump.

Another aspect of the present disclosure is directed to a process of fabricating an electromagnetic circuit. In one embodiment, the process comprises: providing a first sheet of dielectric material including a top surface having at least one conductive trace; depositing a solder bump on the at least one conductive trace; applying a second sheet of dielectric material to the first sheet of dielectric material, the second sheet of dielectric material having a through-hole providing access to the solder bump; bonding the first and second dielectric materials to one another; and machining the solder bump to achieve a desired amount of solder in the solder bump.

Embodiments of the process further may include securing copper wire to the solder bump to secure a through-hole component mounted by the copper wire. The copper wire may be secured to the solder bump by a soldering or reflow process.

Machining the solder bump includes using a drilling or milling process to remove portions of the solder bump. Using the drilling or milling process to machine the solder bump can be a manual procedure or an automated procedure. The process further may include removing bond film resin from the solder bump. The solder bump may include lead-based or lead-free solder. The through-hole may be created by drilling through the second dielectric layer. Bonding the first and second dielectric materials to one another may include curing the dielectric layers under pressure and temperature to form an integral final product. The process further may include applying a silver nanoparticle paste to the solder bump.

BRIEF DESCRIPTION OF THE DRAWINGS

Various aspects of at least one embodiment are discussed below with reference to the accompanying figures, which are not intended to be drawn to scale. The figures are included to provide illustration and a further understanding of the various aspects and embodiments, and are incorporated in and constitute a part of this specification, but are not intended as a definition of the limits of the disclosure. In the figures, each identical or nearly identical component that is illustrated in various figures may be represented by a like numeral. For purposes of clarity, not every component may be labeled in every figure. In the figures:

FIG. 3 is a schematic cross-sectional view of a second sheet of dielectric material applied to the first sheet of dielectric material with bond film sandwiched in between;

DETAILED DESCRIPTION

Figure 1:
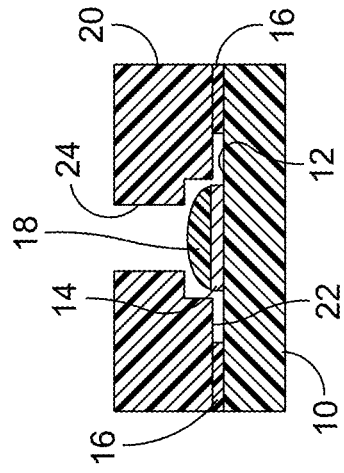
FIG. 1 is a schematic cross-sectional view of a first sheet of dielectric material having a conductive trace provided on an upper surface of the first sheet of dielectric material.

Manufacturing processes described herein may be particularly suitable for fabrication of such circuit structures having small circuit features capable of supporting electromagnetic signals in the range of 8 to 75 GHz or more. Electromagnetic circuit structures in accord with methods described herein may be particularly suitable for application in 28 to 70 GHz systems, including millimeter wave communications, sensing, ranging, etc. Aspects and embodiments described may also be suitable for lower frequency ranges, such as in the S-band (2-4 GHz), X-band (8-12 GHz), or others.

The processes described herein may support smaller arrangements and dimensions than conventional processes are capable. Such conventional circuit boards may be limited to frequencies below about 30 GHz. The processes described herein may allow or accommodate the manufacture of electromagnetic circuits of smaller dimensions, suitable for radio frequency circuits intended to be operated at higher frequencies, using safer and less complex manufacturing, and at lower cost.

Electromagnetic circuits and processes of manufacture in accord with those described herein include laminating techniques to produce electromagnetic circuits and components capable of handling higher frequencies, with lower profiles, and at reduced costs, cycle times, and design risks, than conventional circuits and processes. Examples of techniques include laminating sheets of standard printed circuit board (PCB) laminates, i.e., dielectric material having copper traces, on one another.

Any of the above example techniques and/or others may be combined to make various electromagnetic components and/or circuits. Aspects and examples of such techniques are described and illustrated herein with respect to a radio frequency interconnect to contain and convey an electromagnetic signal along a layer of an electromagnetic circuit in one dimension and vertically through to other layers of the circuit in another dimension. The techniques described herein may be used to form various electromagnetic components, connectors, circuits, assemblies, and systems.

Multilayer printed circuit boards can be configured to enable digital and RF circuitry into a single assembly. This construction decreases the overall size of the printed circuit board. Multilayer printed circuit boards may be bonded using a low dielectric constant, low loss sheet adhesive or bonding film. In one example, the bond film may include a thermoplastic chloro-fluorocopolymer, which has a low dielectric constant PTFE (Teflon® fluorocarbon polymer) suited for microwave stripline packages and other multilayer circuits. In another example, the bond film may include a thermosetting, epoxy-based, silver-filled adhesive film that is used to bond circuit boards to heavy clad metal backplanes, heat sinks and RF module housings. In yet another example, the bond film may include an unreinforced, hydrocarbon-based thin film adhesive particularly suited for high performance, high reliability multi-layer constructions. The bond film can also be used to bond other structural and electrical components to the dielectric. Bond film materials can be used in lamination processes familiar to most circuit fabrication shops. In one embodiment, the bond film is available in a thickness of 0.0015 inch (in) (0.381 millimeter (mm)), in continuous 12 in (305 mm) wide rolls, on standard 3 in inner diameter cores. Other bonding film materials further may be provided.

The present disclosure is directed to a manufacturing method for forming a solder bump interconnections internal to printed circuit boards (PCBs) fabricated by Advanced Manufacturing Technology (AMT) for microwave PWBs. AMT copper wires are provided to replace electroplated vias used in traditional PCBs. In this process, a hole is drilled from the top of the PCB to a pad on an internal layer or is formed by stacking individual layers with pre-cut slot/hole patterns and then laminated. The pad is pre-soldered in advance (solder bump formed). A drill bit removes the top of the solder "bump," sometimes referred to as "spot-facing," to ensure there is no bond film resin remaining on the solder bump and further to ensure no impact to electrical/mechanical/RF performance. The wire is inserted into the board, heat is applied through the conductive wire itself reflowing the solder bump at the bottom of the hole/channel.

Prior to the methods disclosed herein, there were no manufacturing methods designed to clear bond film quickly and inexpensively from a pre-drilled hole in a PCB, especially for "deep" holes, e.g., 300 mils deep, where lasers are ineffective. Embodiments of the methods of the present disclosure are configured to construct z-axis interconnects to enable a strong, compliant z-axis wire interconnection with favorable mechanical, electrical and RF performance. Spot-facing creates a solder bump with a unique shape that is able to accept and reflow a wire once inserted from the top of the board. The shape plays a role in facilitating wetting of the solder to the wire, and controlling the correct amount of solder that is maintained in the hole.

In one embodiment, a spot-facing operation includes removing the top of the solder bump that may be covered by insulating resin, thus exposing the conductor. A geometry of the solder bump at the base of the hole facilitates a correct amount of solder and appropriate wetting and soldering. This operation can be integrated into an additive manufacturing solution to add the capability of embedding conductive copper wires into 3D printed parts, a concept that is not available on the additive market.

In one embodiment, the spot-facing operation uses a drill bit to create a blind hole in a PCB without removing the copper layer that is targeted for the blind hole. This blind hole is created using a system that does not rely on very tightly toleranced features, or the need to use different types of laser powers. Additionally, the operation can be used to develop the interface in holes that are over 300 mils deep, something that a laser is incapable of performing. This spot-facing operation enables blind interconnection features to be created up to 300 mils deep into a board, without removing the target copper layer.

In one embodiment, the solder used to create the solder bump has a reflow temperature sufficiently high to avoid reflow during the bond film lamination operation. The geometry of the bump should enable the solder bump to be reached by the drill bit or other machining implement post lamination. The geometry of the solder bump after the drilling operation has been completed should enable a copper wire to make contact with the solder and transfer enough heat to reflow the interface.

Referring to the drawings, FIG. 1 illustrates a first dielectric layer 10 of a circuit board having a top surface 12. As shown, a conductive trace 14 is applied to the top surface 12 of the first dielectric layer 10. Exemplary dielectric materials may include glass-reinforced epoxy laminate material, e.g., FR-4. Other materials may be provided. As known, a PCB, also referred to as a printed wiring board (PWB), includes a flat sheet of dielectric material having a layer of copper applied to the sheet. The copper layer is formed into conductive lines and traces, including pads by chemical etching or other appropriate processes. A PCB can be configured to include multiple layers having multiple laminate sheets, with bond films being provided between the laminate sheets to secure the laminate sheets to one another during curing.

Figure 2:
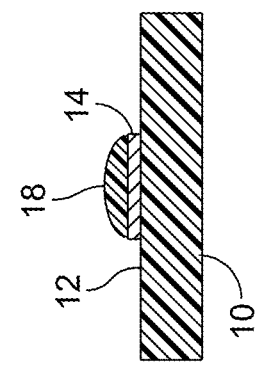
FIG. 2 is a schematic cross-sectional view of the first sheet of dielectric material having a solder bump applied to the conductive trace.

FIG. 2 illustrates the first dielectric layer 10 including a solder bump 18 applied on the conductive trace 14. The solder bump 18 can be any type of solder, e.g., lead-based or lead-free solder. The solder bump 18 can be provided to secure a through-hole component, which is mounted by a copper wire through the board and soldered to traces on the other side of the board. Through-hole mounting may be used for some large components, such as capacitors and connectors.

Figure 3:
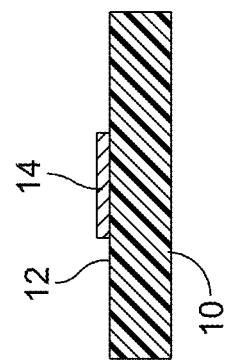

FIG. 3 illustrates a second dielectric layer 20 applied to the first dielectric layer 10, with bond film 16 being disposed between the first dielectric layer and the second dielectric layer to facilitate bonding of the layers. The second dielectric layer 20 includes a bottom surface 22 that faces the top surface 12 of the first dielectric layer 10 when applying the second dielectric layer to the first dielectric layer. In one embodiment, the second dielectric layer 20 can be fabricated from the same material as the first dielectric layer 10, and although not shown, may include conductive traces and bond film on an upper surface of the second dielectric layer. However, the second dielectric layer 20 can be fabricated from a different material than the first dielectric layer 10. As shown, the second dielectric layer 20 has a through-hole 24 formed therein, with the through-hole providing access to the solder bump 28 when the second dielectric layer is applied to the first dielectric layer. In one embodiment, the through-hole 24 is created by drilling through the second dielectric layer 20.

Figure 4:
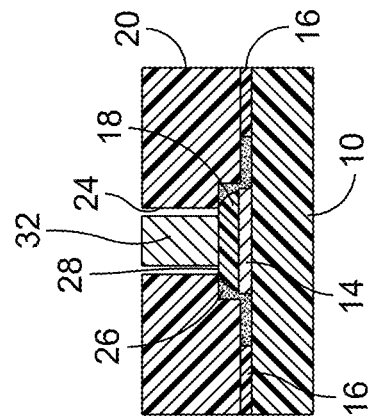
FIG. 4 is a schematic cross-sectional view of the first and second sheets of dielectric material after a bonding process showing bond film resin flow.

FIG. 4 illustrates the first and second dielectric layers 10, 20 being bonded to one another. Although two dielectric layers are shown, additional dielectric layers may be provided to create multiple layers. Once stacked, the dielectric layers 10, 20 are cured under pressure and temperature to form an integral final product having a uniform thickness. Once bonded, the bond film 16 may flow, which results in the bond film resin 26 covering the solder bump 18. As shown, the bond film resin 26 covers the solder bump 18 and migrates in the space created between the first dielectric layer 10 and the second dielectric layer 20. As described above, this migration of the bond film resin 26 is undesirable as it covers the electrically conductive trace 14 and solder bump 18, and can adversely impact the joint during reflow.

Figure 5:
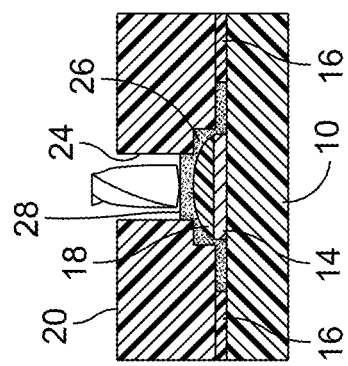
FIG. 5 is a schematic cross-sectional view showing removal of bond film resin being removed from the solder bump and machining of the solder bump.

FIG. 5 illustrates the removal of the bond film resin 26 from a surface 28 of the solder bump 18. As shown, a drill bit 30, or other implement, such as a rotary cutter, is used to remove the bond film resin 26 from the through-hole and from the surface 28 of the solder bump 18. For example, a drill having a drill bit can be used to remove excess bond film resin 26 from the top surface 28 of the solder bump 18 and from a wall forming the through-hole 24. In another example, a more formal process can be employed. In one embodiment, a milling operation can be used to remove the excess bond film resin 26 from the solder bump 18 and the wall forming the through-hole 24. The milling operation can use rotary cutters to perform the removal of unwanted material. The removal of excess bond film resin 26 can be performed by a manual or an automated process.

In addition to removing excess and unwanted bond film resin 26 from the surface 28 of the solder bump 18, the process can also remove a desired amount of solder from the solder bump to result in a solder bump having a precisely controlled amount or volume of solder. This process can also be used to present a clean top surface 28 on the solder bump 18 for soldering a copper wire or other electrical component to the solder bump. In an optional process step, a silver nanoparticle paste may be applied, as by spraying, to improve the connection of a copper wire to the solder pad. The paste is not shown in the drawing figures, but constitutes a very thin layer of silver nanoparticles on the top surface 28 of the solder bump 18.

Figure 6:
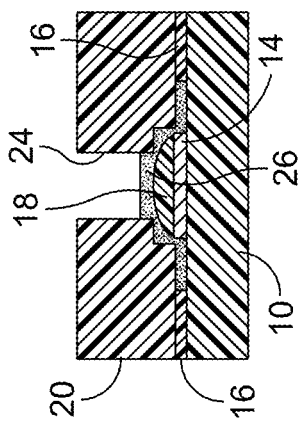
FIG. 6 is a schematic cross-sectional view showing copper wire being secured to the solder bump.

FIG. 6 illustrates the bonding, e.g., reflow or soldering, of a copper wire 32 on the solder bump 18. As shown, an end of the copper wire 32 is inserted into the through-hole 24 and extended to the clean, top surface 28 of the solder bump 18. Other conductive materials may be used in place of the copper wire 32, e.g., copper alloys. Other electrical components may be used in place of the copper wire 32 as well. The end of the copper wire 32 touches the top surface 28 of the solder bump 18 and is exposed to heat to secure mechanically and electrically the copper wire to the conductive trace 14 with the solder from the solder bump creating the electrical and mechanical connection. One technique is subjecting the assembled package to a reflow process to reflow the solder bump 18 and to attach the copper wire 32 to the conductive trace 14.

Figure 7B:
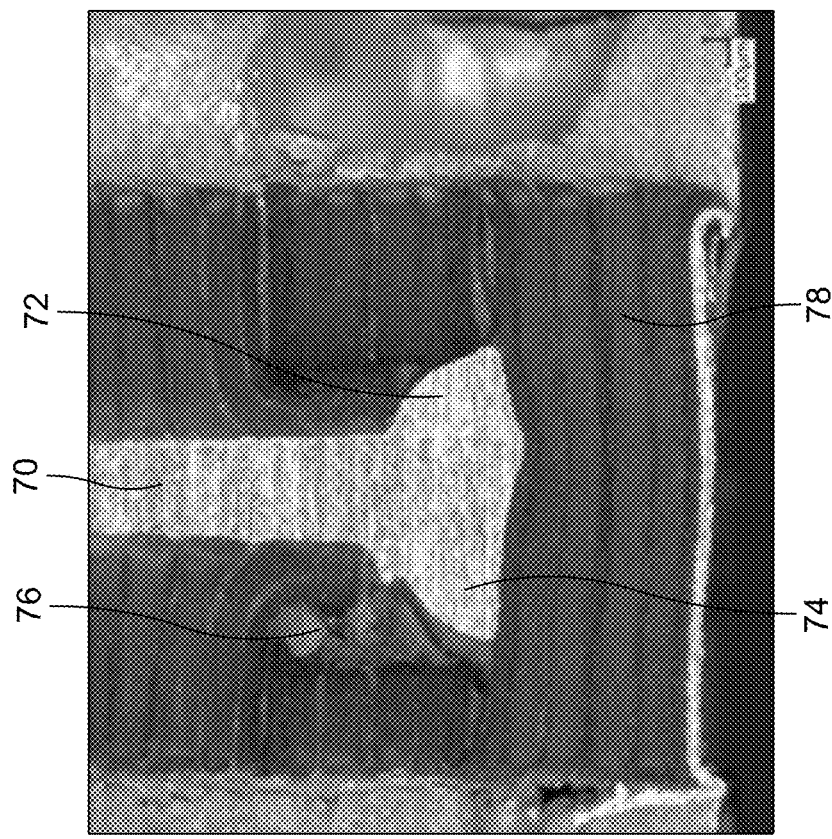
FIGS. 7A and 7B are cross-sectional views of a flat wire copper vertical launch (CVL) subjected to a spot-facing operation.
Figure 7A:
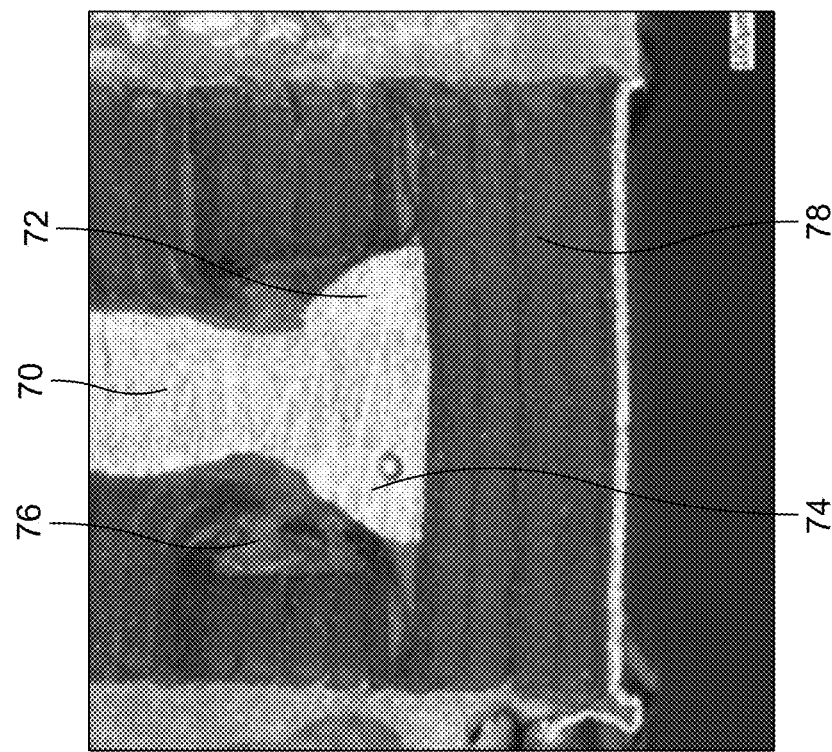

FIGS. 7A and 7B illustrate sectional views of a flat wire copper vertical launch (CVL) subjected to a spot-facing operation. As shown, a copper wire 70 is secured to a solder pad 72 disposed on a copper trace 74. Residual bond film resin 76 is removed from the solder pad 72, and the solder pad is machined to a desired height and quantity. Meanwhile, as shown, residual bond film resin 76 remains between the solder material and dielectric material 78 through which the copper wire 70 extends and on which the conductive trace 74 is disposed on. This residual bond film resin 76 does not effect the quality of the solder bond between the coper wire 70 and the copper conductive trace 74.

Thus, the CVL or z-axis interconnect spot-face operation successfully removes the bond film from the top of the solder bump and allows the copper wire to reflow the solder bump at the bottom of the hole. Due to the solder bump at the base of the interface being between 0.010 in (10 mil) and 0.015 in (15 mil) high, this operation can be completed using a milling machine as most can mill to +/−0.001 in (1 mil) in depth.

It should be appreciated that the methods described herein can be employed on circuit designs having varying geometries and sizes. The methods described herein are exemplary, and are not limited to circuit design described and shown herein.

For this spot-facing operation, machine should be set to mill down until it is approximately 5 mil above the copper trace to successfully clear the bond film resin from the top of the bump. If the solder bump height requirement needed to be reduced, a $CO_2$ laser could be utilized to ablate the bond film resin without disturbing the solder bump at the base of the hole. The CVL spot-facing operation created repeatable results and significantly increased the manufacturing yield of test devices.

In some embodiments, the resulting circuit board structure is merely an example and portion of a structure in which an electromagnetic circuit may be provided. Further extent of the substrates shown may accommodate various circuit components, and additional substrates having additional layers to accommodate additional circuit components may be provided in various embodiments. Typically, a portion of a circuit may be disposed on a particular layer, and may include ground planes above and/or below, and other portions of a total circuit (or system) may exist at different regions of the same layer or on other layers.

In some embodiments, the methods disclosed herein can be employed to remove bond film resin from any type of feature.

It is to be appreciated that embodiments of the processes discussed herein are not limited in application to the details of construction and the arrangement of components set forth in the following description or illustrated in the accompanying drawings. The processes are capable of implementation in other embodiments and of being practiced or of being carried out in various ways. Examples of specific implementations are provided herein for illustrative purposes only and are not intended to be limiting. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. Any references to front and back, left and right, top and bottom, upper and lower, end, side, vertical and horizontal, and the like, are intended for convenience of description, not to limit the present systems and processes or their components to any one positional or spatial orientation.

The term "radio frequency" as used herein is not intended to be limited to a particular frequency, range of frequencies, band, spectrum, etc., unless explicitly stated and/or specifically indicated by context. Similarly, the terms "radio frequency signal" and "electromagnetic signal" are used interchangeably and may refer to a signal of various suitable frequency for the propagation of information-carrying signals for any particular implementation. Such radio frequency signals may generally be bound at the low end by frequencies in the kilohertz (kHz) range, and bound at the high end by frequencies of up to hundreds of gigahertz (GHz), and explicitly includes signals in the microwave or millimeter wave ranges. Generally, processes in accord with those described herein may be suitable for handling non-ionizing radiation at frequencies below those conventionally handled in the field of optics, e.g., of lower frequency than, e.g., infrared signals.

Various embodiments of radio frequency circuits may be designed with dimensions selected and/or nominally manufactured to operate at various frequencies. The selection of appropriate dimensions may be had from general electromagnetic principles and are not presented in detail herein.

Having thus described several aspects of at least one embodiment, it is to be appreciated various alterations, modifications, and improvements will readily occur to those skilled in the art. Such alterations, modifications, and improvements are intended to be part of this disclosure and are intended to be within the scope of the disclosure. Accordingly, the foregoing description and drawings are by way of example only.

What is claimed is:

1. A process of fabricating an electromagnetic circuit, the process comprising:
   providing a first sheet of dielectric material including a top surface having at least one conductive trace;
   depositing a solder bump on the at least one conductive trace;
   applying a second sheet of dielectric material to the first sheet of dielectric material with bond film sandwiched in between, the second sheet of dielectric material having a through-hole providing access to the solder bump;
   bonding the first and second dielectric materials to one another; and
   removing bond film resin from the solder bump.

2. The process of claim 1, wherein removing bond film resin includes using a drilling or milling process to remove the bond film resin.

3. The process of claim 2, wherein using the drilling or milling process to remove the bond film resin can be a manual procedure or an automated procedure.

4. The process of claim 2, further comprising machining the solder bump by the drilling or milling process to achieve a desired amount of solder in the solder bump.

5. The process of claim 1, further comprising securing copper wire to the solder bump to secure a through-hole component mounted by the copper wire.

6. The process of claim 5, wherein the copper wire is secured to the solder bump by a soldering or reflow process.

7. The process of claim 1, wherein the solder bump includes lead-based or lead-free solder.

8. The process of claim 1, wherein the through-hole is created by drilling through the second dielectric layer.

9. The process of claim 1, wherein bonding the first and second dielectric materials to one another includes curing the dielectric layers under pressure and temperature to form an integral final product.

10. The process of claim 1, further comprising applying a silver nanoparticle paste to the solder bump.

11. A process of fabricating an electromagnetic circuit, the process comprising:
    providing a first sheet of dielectric material including a top surface having at least one conductive trace;
    depositing a solder bump on the at least one conductive trace;
    applying a second sheet of dielectric material to the first sheet of dielectric material, the second sheet of dielectric material having a through-hole providing access to the solder bump;
    bonding the first and second dielectric materials to one another; and
    machining the solder bump to achieve a desired amount of solder in the solder bump.

12. The process of claim 11, wherein machining the solder bump includes using a drilling or milling process to remove portions of the solder bump.

13. The process of claim 12, wherein using the drilling or milling process to machine the solder bump can be a manual procedure or an automated procedure.

14. The process of claim 12, further comprising removing bond film resin from the solder bump.

15. The process of claim 11, further comprising securing copper wire to the solder bump to secure a through-hole component mounted by the copper wire.

16. The process of claim 15, wherein the copper wire is secured to the solder bump by a soldering or reflow process.

17. The process of claim 11, wherein the solder bump includes lead-based or lead-free solder.

18. The process of claim 11, wherein the through-hole is created by drilling through the second dielectric layer.

19. The process of claim 11, wherein bonding the first and second dielectric materials to one another includes curing the dielectric layers under pressure and temperature to form an integral final product.

20. The process of claim 11, further comprising applying a silver nanoparticle paste to the solder bump.

* * * * *